United States Patent
Kanyandekwe et al.

(10) Patent No.: US 11,854,805 B2
(45) Date of Patent: Dec. 26, 2023

(54) METHOD FOR PRODUCING SIGE-BASED ZONES AT DIFFERENT CONCENTRATIONS OF GE

(71) Applicant: COMMISSARIAT A L'ENERGIE ATOMIQUE ET AUX ENERGIES ALTERNATIVES, Paris (FR)

(72) Inventors: Joël Kanyandekwe, Grenoble (FR); Cyrille Le Royer, Grenoble (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 71 days.

(21) Appl. No.: 17/584,771

(22) Filed: Jan. 26, 2022

(65) Prior Publication Data
US 2022/0238338 A1 Jul. 28, 2022

(30) Foreign Application Priority Data
Jan. 26, 2021 (FR) ...................................... 21 00699

(51) Int. Cl.
*H01L 21/8234* (2006.01)
*H01L 21/02* (2006.01)
(Continued)

(52) U.S. Cl.
CPC ............... *H01L 21/02694* (2013.01); *H01L 21/823807* (2013.01); *H01L 21/823814* (2013.01);
(Continued)

(58) Field of Classification Search
CPC ..... H01L 21/823807; H01L 21/823412; H01L 21/02381; H01L 21/02532; H01L 21/088;
(Continued)

(56) References Cited

U.S. PATENT DOCUMENTS 7,018,901 B1  3/2006  Thean et al.
10,205,021 B1 2/2019  Reboh
(Continued)

FOREIGN PATENT DOCUMENTS

EP  3 503 175 A1  6/2019
EP  3 671 826 A1  6/2020
(Continued)

OTHER PUBLICATIONS

French Preliminary Search Report dated Oct. 20, 2021 in French Application 21 00699 filed on Jan. 26, 2021, 11 pages (with English Translation of Categories of Cited Documents & Written Opinion).

*Primary Examiner* — Julio J Maldonado
*Assistant Examiner* — Sandra Milena Rodriguez Villanu
(74) *Attorney, Agent, or Firm* — Oblon, McClelland, Maier & Neustadt, L.L.P.

(57) ABSTRACT

A method for forming SiGe-based regions with different Ge concentrations is provided. After defining the regions 1, 2 on a SOI substrate, a grating of masking patterns is formed on at least one region 2. After the epitaxial growth of a Ge-based layer in each of the regions, a first vertical diffusion is carried out. A second horizontal diffusion is then carried out such that the Ge diffuses beneath the masking patterns of the region 2. Thus, the region 2 has a Ge concentration that is lower than the Ge concentration of the region 1.

13 Claims, 6 Drawing Sheets

SECTION E-E (51) Int. Cl.
*H01L 21/8238* (2006.01)
*H01L 27/12* (2006.01)

(52) U.S. Cl.
CPC .... *H01L 27/1203* (2013.01); *H01L 21/02381* (2013.01); *H01L 21/02532* (2013.01)

(58) Field of Classification Search
CPC ....... H01L 21/02002; H01L 21/823456; H01L 27/0922; H01L 27/1203; H01L 29/6604; H01L 29/511; H01L 29/512
See application file for complete search history.

(56) References Cited

U.S. PATENT DOCUMENTS

| | | | |
|---|---|---|---|
| 11,217,446 | B2 | 1/2022 | Posseme et al. |
| 2015/0311286 | A1 | 10/2015 | Lee et al. |
| 2016/0372551 | A1* | 12/2016 | Doris .................... H01L 29/161 |
| 2017/0040323 | A1 | 2/2017 | Lee et al. |
| 2017/0084454 | A1* | 3/2017 | Bedell ................. H01L 29/0649 |
| 2020/0203161 | A1 | 6/2020 | Posseme et al. |

FOREIGN PATENT DOCUMENTS

| | | | |
|---|---|---|---|
| JP | | 5079511 B2 | 11/2012 |
| WO | WO 2006/039038 A2 | | 4/2006 |

* cited by examiner

METHOD FOR PRODUCING SIGE-BASED ZONES AT DIFFERENT CONCENTRATIONS OF GE

TECHNICAL FIELD

The present invention relates to the field of microelectronics. It can be used to co-integrate different SiGe-based regions with different Ge concentrations on the same substrate. One particularly advantageous application concerns the production of co-integrated transistors with different gate lengths for a substantially identical threshold voltage.

PRIOR ART

In CMOS technology, i.e. technology based on complementary metal-oxide-semiconductor transistors, the performance of p-type transistors can be improved by the use of silicon-germanium SiGe based channels, in particular from fully depleted thin layer on insulator type substrates, for example Fully Depleted Silicon On Insulator (FDSOI) substrates.

SiGe channels can be produced locally using a technique known as germanium enrichment, as shown in FIGS. 1 to 5.

Figure 1:
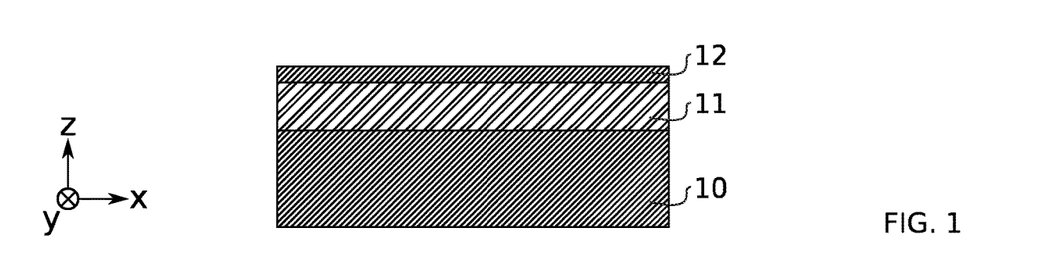
FIGS. 1 to 5 diagrammatically show a method for forming a SiGe-based region according to the prior art.
Figure 2:
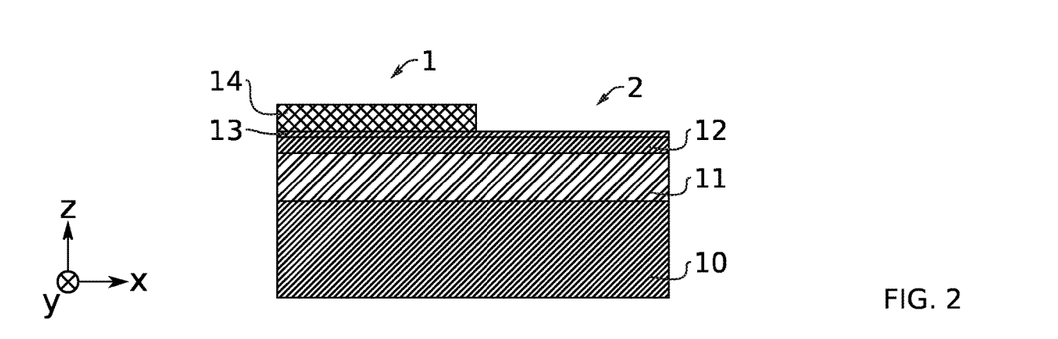
Figure 3:
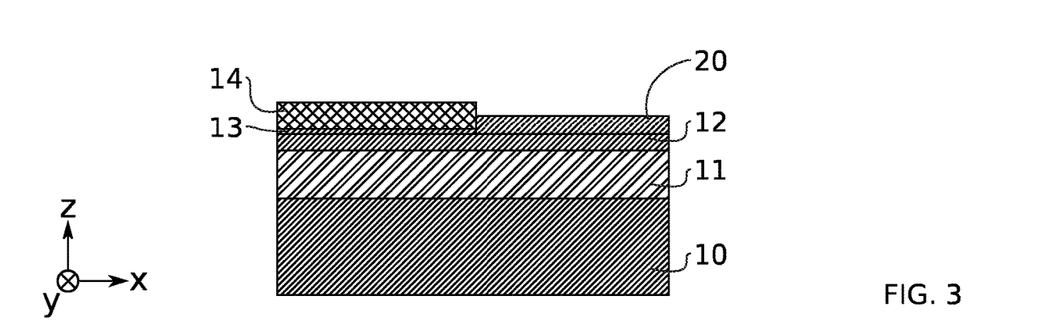
Figure 4:
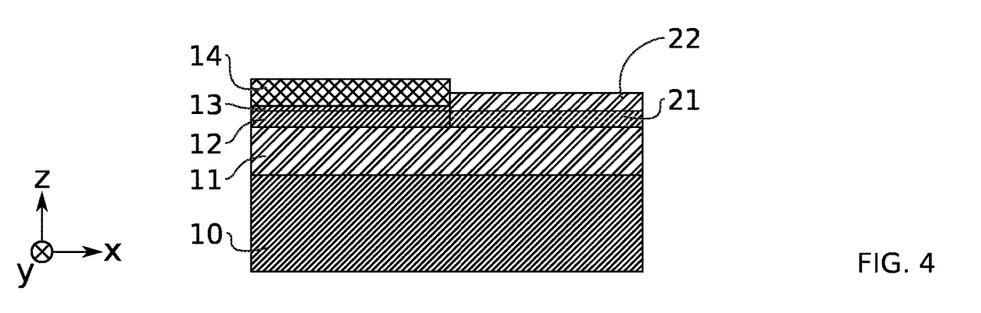
Figure 5:
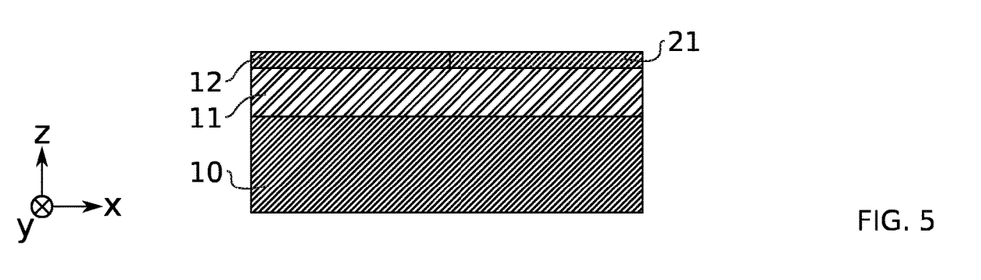

From an SOI or FDSOI substrate (FIG. 1), a hard mask 14 made of silicon nitride, for example, is formed in order to define an enrichment region 2 (FIG. 2). After deoxidation of the native oxide 13 on the surface of the topSi 12 in the enrichment region 2, a Ge-based layer 20 is formed by epitaxial growth on the exposed portion of topSi in this enrichment region 2 (FIG. 3). Ge enrichment, i.e. the diffusion of Ge from the Ge-based layer 20 to the topSi portion, is then achieved by thermal annealing in an oxidising atmosphere (FIG. 4). A SiGe-based portion 21 is thus formed within the topSi 12. The hard mask 14 and the residual oxide layer 22 are then removed to expose the topSi 12 and the SiGe-based portion 21 (FIG. 5).

This SiGe-based portion 21 typically forms an active region on which transistor gates can be formed. STI isolation trenches are then etched to isolate the transistors from one another.

One first drawback is that the one or more SiGe-based portions 21 thus obtained at the end of this method all have the same Ge concentration. A second drawback of this solution is that the compressive stress initially generated by the condensation of the Ge is partially lost during the etching of the STI trenches. This reduces the mobility of the holes and thus the performance of the p-type transistors. This is especially critical when the active region is short in length, typically for a length dimension of less than about 1 μm.

One solution to compensate for this loss of compressive stress consists of reintroducing compressive elements into the SiGe-based portion. For example, the US patent No. 2014/0349460 A1 discloses local Ge enrichment of the SiGe-based portion, between the gate stacks, based on the same Ge enrichment principle. The repeated use of the Ge enrichment module can result in different SiGe-based portions or regions with different Ge concentrations.

The drawback of this solution is that it degrades the quality of the interface between the gate stack and the SiGe portion.

There is thus a need to limit or even eliminate the problems encountered with the known solutions.

In particular, one purpose of the present invention is to provide a method for producing SiGe-based regions with different Ge concentrations, and an improved stress state and/or interface state.

SUMMARY

In order to reach this objective, according to one embodiment, the invention provides a method for forming at least two SiGe-based regions in a silicon-based layer, comprising the following steps of:

Providing a substrate comprising said silicon-based layer,

Defining at least a first enrichment region by exposing a first portion of the silicon-based layer, Forming, by epitaxial growth, a first Ge-based layer with an initial Ge concentration $[Ge]0$ on the first portion, at said first enrichment region, Diffusing, during a first diffusion by oxygen annealing, in at least a first so-called vertical direction, perpendicular to the first Ge-based layer, the germanium of the first Ge-based layer in the first portion corresponding to the first enrichment region, said first portion thus becoming a first SiGe-based portion having a first Ge concentration $[Ge]1$, and the first Ge-based layer thus becoming a first oxide layer.

Advantageously, the method further comprises the following steps of:

Defining at least a second enrichment region where the silicon-based layer is exposed, said at least one second enrichment region being separate from the first enrichment region, Forming a grating of masking patterns on the exposed silicon-based layer within the at least one second enrichment region, so as to define a plurality of transient portions of the silicon-based layer, Forming, by epitaxial growth, a second Ge-based layer with the initial Ge concentration $[Ge]0$ on the transient portions of the silicon-based layer, at said second enrichment region, Diffusing, by oxygen annealing, preferably during the first diffusion, at least in the vertical direction, the germanium of the second Ge-based layer into said transient portions, such that these become SiGe-based transient portions each having the first Ge concentration $[Ge]1$, After diffusion of the germanium by oxygen annealing in the vertical direction, diffusing, during a second diffusion, at least in a second so-called lateral direction, parallel to the silicon-based layer, the germanium of said SiGe-based transient portions within the silicon-based layer, beneath the grating of masking patterns, so as to form at least a second SiGe-based portion having a second Ge concentration $[Ge]2$ that is lower than $[Ge]1$, at the second enrichment region.

Thus, the second diffusion and the grating of masking patterns allow the Ge concentration to be homogenised and reduced at the second enrichment region. This allows a second SiGe-based portion to be formed with a different Ge concentration than the first SiGe-based portion. Advantageously, the method allows a plurality of SiGe-based portions with different Ge concentrations to be co-integrated, without the need for a plurality of successive enrichment modules.

An alternative solution, which differs from the claimed solution but which could have been considered within the scope of the development of the present invention, would have consisted in locally repeating the same Ge enrichment method several times on certain regions of interest so as to increase the Ge concentration in these regions of interest.

This alternative solution was not retained within the scope of the present invention because it has been identified that successive repetition of the enrichment module is cumbersome to set up and thus not of interest from a technical and cost perspective.

By contrast, the present invention aims to decrease the Ge concentration in certain regions of interest. In particular, the grating of masking patterns prevents Ge originating from the second Ge-based layer from diffusing into the silicon-based layer in the vertical direction beneath and vertical to the masking patterns, typically during the first diffusion. Parts of the silicon-based layer are thus retained beneath the grating of masking patterns, in a manner complementary to the SiGe-based transient portions formed during vertical diffusion. The second diffusion, which takes place mainly laterally and which follows the vertical diffusion, thus allows all of the Si-based parts and the SiGe-based transient portions to be transformed into a single, second SiGe-based portion with a substantially uniform second Ge concentration [Ge]2. During this second diffusion, the SiGe-based transient portions become depleted in Ge to the benefit of the Si-based parts which become enriched in Ge. This second SiGe-based portion thus has a Ge concentration [Ge]2 that is lower than [Ge]1.

The method thus allows a plurality of SiGe-based portions with different Ge concentrations to be formed from a single modified enrichment module.

According to one advantageous example application, the method allows for the formation of a device comprising a silicon-based layer comprising at least a first SiGe-based portion having a first Ge concentration [Ge]1, and at least a second SiGe-based portion having a second Ge concentration [Ge]2 that is lower than [Ge]1, and first and second gates on the first and second SiGe-based portions respectively, said first and second gates having first and second gate lengths Lg1 and Lg2 respectively, the first and second Ge concentrations [Ge]1 and [Ge]2 and the gate lengths Lg1 and Lg2 being such that the first and second gates have a substantially identical threshold voltage.

It is understood that the first and second gates referred to in this particular example can correspond more broadly to masking patterns based on a different material to the material of the masking patterns used in the second enrichment region. Thus, the masking patterns used in the second enrichment region can be referred to as first masking patterns or "Mask_x", and the masking patterns used on the first and second SiGe-based portions can be referred to as second masking patterns or "Mask_y". In the case of a MOS device these "Mask_y" masking patterns are typically gates.

BRIEF DESCRIPTION OF THE FIGURES

The aims, purposes, features and advantages of the invention will be better understood upon reading the detailed description given of one embodiment thereof, which is illustrated by means of the following accompanying drawings, in which.

The drawings are provided by way of example and are not intended to limit the scope of the invention. They constitute diagrammatic views intended to ease the understanding of the invention and are not necessarily to the scale of practical applications. In particular, in the operating diagrams, the thicknesses of the different layers, vias, patterns and reliefs are not representative of reality.

DETAILED DESCRIPTION

Before giving a detailed review of embodiments of the invention, optional features are set out below, which can be used in combination with or in replacement of one another.

According to one example, the transient portions are defined between the masking patterns, projecting in the first direction. According to one example, the first enrichment region is free of masking patterns.

According to one example, the first and second SiGe-based portions are formed simultaneously.

According to one example, the grating of masking patterns is formed such that it has an aperture density D strictly comprised between 0 and 1, $0<D<1$, and the second Ge concentration [Ge]2 is proportional to this aperture density such that $[Ge]2 = D \cdot [Ge]1$.

According to one example, the second enrichment region has an aperture density strictly lower than the aperture density of the first enrichment region. The first enrichment region is typically free of masking patterns, unlike the second enrichment region.

According to one example, the first and second enrichment regions have the same surface area S, and the surface of the first portion of the silicon-based layer exposed at the first enrichment region has said surface area S, whereas the transient portions of the silicon-based layer exposed at the second enrichment region have a total surface area S' that is strictly smaller than S.

According to one example, the grating of masking patterns comprises masking patterns with a characteristic masking dimension Lmi, spaced apart from one another by a grating period $Lo_i$, such that $10 > Lo_i/Lm_i > 2$.

According to one example, the characteristic masking dimension $Lm_i$ is selected such that it is less than twice a diffusion distance d of the germanium within the silicon-based layer in the second direction, during the second diffusion.

According to one example, the masking patterns are in the form of parallel lines, square or rectangular pads, or a gate.

According to one example, the first and second Ge-based layers are formed by one and the same epitaxial growth, such that the first and second Ge-based layers have the same initial Ge concentration [Ge]0 and the same thickness.

According to one example, the second diffusion takes place in a neutral or non-oxidising atmosphere.

According to one example, the second diffusion is configured in time and temperature such that a diffusion distance d of the germanium in the second direction is greater than 10 nm and/or less than 30 nm.

According to one example, the second diffusion is carried out at a temperature T2 greater than 950° C. and/or less than 1,150° C.

According to one example, the second diffusion is carried out for a time t2 greater than 5 s and/or less than 60 s.

According to one example, the second diffusion is carried out under similar conditions to those of the first diffusion, such that the second diffusion forms a continuation of the first diffusion.

According to one example, the method further comprises forming first and second gates on the first and second SiGe-based portions respectively, said first and second gates having first and second gate lengths Lg1 and Lg2 respectively, the first and second Ge concentrations [Ge]1 and [Ge]2 and the gate lengths Lg1 and Lg2 being such that the first and second gates have a substantially identical threshold voltage.

In the present application, "diffusion" is understood to mean a solid-state diffusion phenomenon. A diffusion carried out in the z-direction means that this diffusion occurs at least along z, preferably mainly along z. This does not mean that vertical diffusion occurs only along z. Similarly, a diffusion carried out laterally, in an x-direction, means that this diffusion occurs at least along x, preferably mainly along x. This does not mean that lateral diffusion occurs only along x.

It is specified that, within the scope of the present invention, the terms "on", "overlying", "covers", "underlying", "facing" and the equivalents thereof do not necessarily mean "in contact with". Thus, for example, the deposition of a first layer on a second layer does not necessarily mean that the two layers are directly in contact with one another, but rather means that the first layer covers at least partially the second layer while being either directly in contact therewith, or while being separated therefrom by at least one other layer or at least one other element.

Moreover, a layer can be constituted by a plurality of sub-layers made of the same material or made of different materials.

A material A-"based" substrate, film or layer is understood to mean a substrate, film or layer comprising this material A only or comprising this material A and optionally other materials, for example alloying elements and/or doping elements. Thus, a silicon-based layer can mean a Si layer, a doped Si layer or a SiGe alloy layer. A germanium-based layer can mean a Ge layer, a doped Ge layer or a SiGe alloy layer.

Several embodiments of the invention implementing successive steps of the manufacturing method are described hereinbelow. Unless specified otherwise, the adjective "successive" does not necessarily imply that the steps immediately follow on from one another, although this is generally preferred, and they can be separated by intermediate steps.

Moreover, the term "step" is understood to mean the performance of a part of the method, and can denote a set of sub-steps. Moreover, the term "step" does not necessarily mean that the actions carried out during a step are simultaneous or immediately successive. Certain actions of a first step can in particular be followed by actions related to a different step, and other actions of the first step can be resumed thereafter. Thus, the term step does not necessarily mean unitary and inseparable actions in time and in the sequence of the phases of the method.

A "substantially identical or substantially constant" threshold voltage Vth is understood to mean a threshold voltage Vth defined according to a certain specification, for example between −0.1 V and −0.15 V.

A preferably orthonormal coordinate system comprising the x, y, z axes is shown in the accompanying figures. If a single coordinate system is shown on a whole sheet of figures, this coordinate system applies to all the figures on that sheet.

In the present patent application, the thickness of a layer is considered in a direction normal to the main extension plane of the layer. Thus, a layer typically has a thickness along z. The relative terms "on", "overlying", "beneath" and "underlying" refer to positions taken in the z-direction.

The terms "vertical" and "vertically" refer to a direction along z. The terms "horizontal" and "horizontally" refer to a direction in the xy-plane. The terms "lateral" and "laterally" refer to a direction in the xy-plane.

An element located "vertical to" or "in line with" another element means that these two elements are both located on the same line perpendicular to a plane in which a bottom or top face of a substrate primarily extends, i.e. on the same line oriented vertically in the figures.

In the present patent application, concentrations are expressed in at. %.

One objective of the invention consists of co-integrating SiGe regions of the same thicknesses with different concentrations [Ge]1, [Ge]2, [Ge]3, . . . without using a plurality of successive enrichment modules. According to one principle of the invention, different gratings of masking patterns are used in the enrichment regions, and lateral diffusion is carried out to form SiGe-based portions of uniform concentration in said enrichment regions.

The germanium enrichment method is sometimes also referred to in the literature as the germanium condensation method.

A first example implementation of the method is shown in FIG. 6A to 11B. In this example, for a given value of X (X=6

... 11), Fig. XA is a diagram of an overhead view of the device during manufacture and Fig. XB is the corresponding sectional diagram.

Figure 6A:
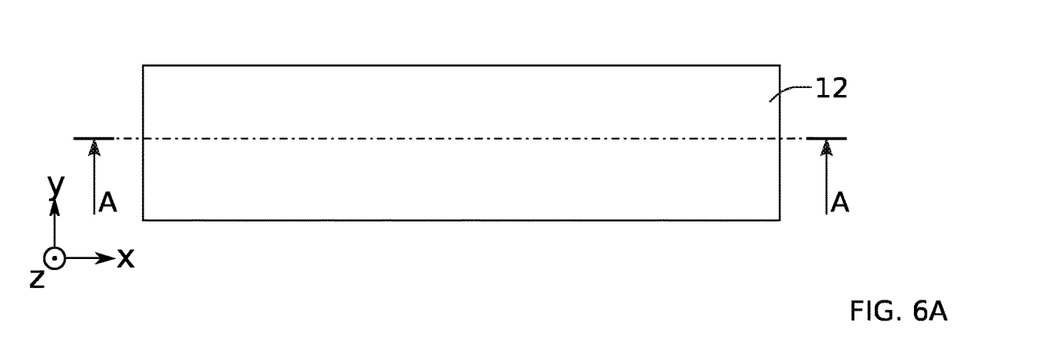
FIG. 6A diagrammatically shows an overhead view of a step of a method for forming SiGe-based regions according to one embodiment of the present invention.
Figure 6B:
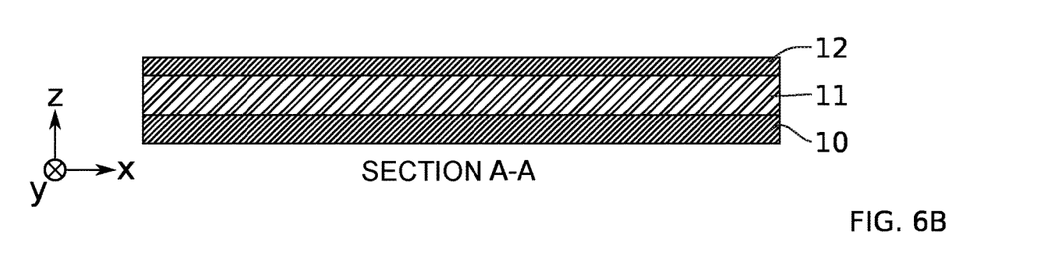
FIG. 6B diagrammatically shows a sectional view of the step of the method for forming SiGe-based regions shown in FIG. 6A.

According to one embodiment, a silicon-on-insulator type substrate is firstly provided (FIG. 6A, 6B). In a known manner, such a substrate typically comprises a thin layer 12 of silicon, also referred to as topSi, on a layer 11 of buried oxide referred to as BOX, the assembly formed thereby being on a substrate 10 made of so-called bulk silicon. According to an alternative embodiment, the topSi can be replaced by a thin layer 12 made of SiGe. The topSi 12 typically has a thickness e comprised between 5 nm and 15 nm, for example 6 nm to 8 nm.

Figure 7A:
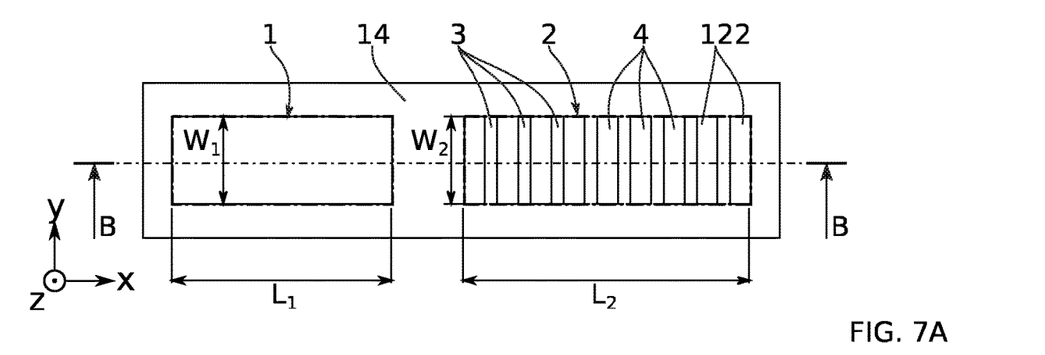
FIG. 7A diagrammatically shows an overhead view of a step of a method for forming SiGe-based regions according to one embodiment of the present invention.
Figure 7B:
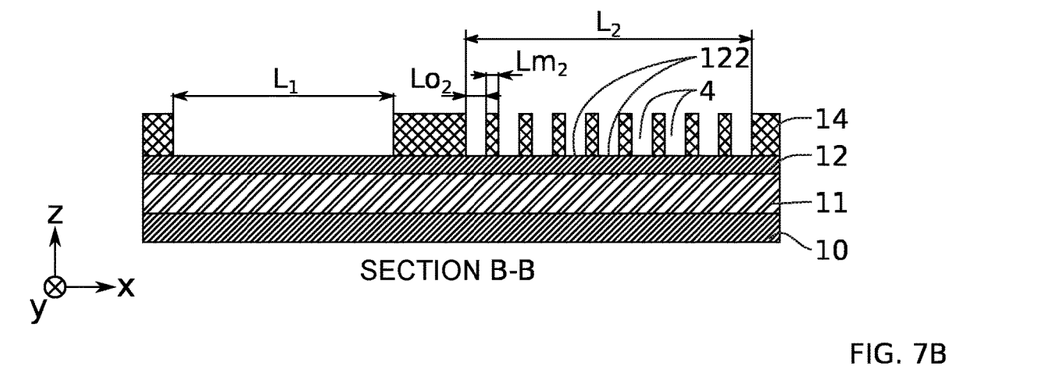
FIG. 7B diagrammatically shows a sectional view of the step of the method for forming SiGe-based regions shown in FIG. 7A.

As shown in FIG. 7A, 7B, a first enrichment region 1 and a second enrichment region 2 are defined, typically by lithography/etching of a SiN- or $SiO_2$-based hard mask 14. The first region 1 thus forms an aperture within the hard mask 14, exposing the surface of the topSi 12. The first region 1 has a width W1 and a length L1. The second region 2 has a width W2 and a length L2. It typically comprises a plurality of apertures 4 within the hard mask 14, exposing surfaces 122 of the topSi 12.

The first region 1, referred to as the reference region, is free of masking patterns as in the case of a standard enrichment method. It is intended to form a first SiGe-based portion with a Ge concentration [Ge]1. The second region 2, referred to as the modified region, is partially masked by a grating of masking patterns 3 alternating with apertures 4. This second region 2 is intended to form a second SiGe-based portion with a Ge concentration [Ge]2. Advantageously, the grating of masking patterns can be defined during the lithography/etching step for the hard mask 14. This dispenses with an additional definition step.

In this example, only one modified region 2 is shown. This case is easily scaled up to a plurality of modified regions i (i=2 ... m). The reference region and the modified regions are intended to form active SiGe-based regions at the end of the method. Such active regions can advantageously be used to form transistors, in particular p-type field effect transistors (pFETs).

The grating of masking patterns has masking patterns 3 and apertures 4. The masking patterns 3 can be in the form of lines, that are for example parallel to one another, as shown in FIG. 7B, or in the form of square or rectangular pads, or in the form of a gate, or more generally, in any other form that allows the topSi 12 to be masked with a homogeneous distribution. The apertures 4 have one or more shapes that are complementary to those of the masking patterns 3. The masking patterns 3 are preferably evenly distributed along a grating.

Rules for the dimensioning of the grating of masking patterns are presented hereinbelow by way of example and in a non-limiting way.

The masking patterns 3 typically have a characteristic masking dimension $Lm_2$ of the order of a few tens of nanometres. They can be spaced apart from one another by a grating period $Lo_2$ also of the order of a few tens of nanometres, preferably greater than $Lm_2$. This period corresponds to the characteristic dimension along x of the apertures 4 in the hard mask 14 in the second region 2.

The width $W_2$ and the length $L_2$ are large compared to the dimensions $Lm_2$, $Lo_2$.

In particular, the length L2 can be of the order of a few microns, for example of the order of 5 μm. The characteristic dimension $Lm_2$ is preferably larger than a minimum critical dimension imposed by the lithography resolution. Thus, $Lm_2$ is typically greater than or equal to 15 nm. For the same reasons of lithography resolution, the period of the grating $Lm_2+Lo_2$ is preferably greater than or equal to about 60 nm.

For reasons related to solid-phase diffusion and explained hereinbelow, the dimension $Lm_2$ is preferably less than twice a characteristic diffusion distance d of the Ge. The grating period $Lo_2$ is preferably not too large compared to $Lm_2$, for the same reasons concerning diffusion. Thus, $Lo_2$ is preferably less than ten times $Lm_2$, and preferably less than eight times $Lm_2$. This results in a SiGe-based portion with improved homogeneity of Ge concentration. $Lo_2$ can be more than twice $Lm_2$.

The grating of masking patterns 3 thus has an aperture density D defined as being the ratio of the surface area of the exposed surfaces 122 of the topSi 12 in the second region 2 (corresponding to the apertures 4), to the total surface area S of the second region 2. In the case shown in FIG. 7B, $S=W_2 \cdot L_2$. The exposed surfaces 122 have a total surface area $S'=Lo_2 \cdot W_2 \cdot (n+1)$, where n is the number of lines 3.

The aperture density D, strictly comprised between 0 and 1, $0<D<1$, is thus equal to $D=S'/S=(n+1) \cdot Lo_2/L_2$. When n is large enough, the aperture density D is approximately: $D \approx Lo_2/(Lm_2+Lo_2)$.

The Ge concentration [Ge]2 obtained at the end of the method depends on this aperture density D. In particular, [Ge]2=D·[Ge]1.

Thus, the grating of masking patterns can be dimensioned as a function of the final Ge concentration desired. For example, for a Ge concentration in the reference region [Ge]1=25%, and for a desired concentration in the region 2 [Ge]2=20%, an aperture density D=[Ge]2/[Ge]1=0.8 is chosen. For a length L2=5 μm, one possible choice of the parameters Lm2, Lo2, n can be: Lm2=25 nm, Lo2=100 nm, n=41. For a length L2=2 μm, one possible choice of the parameters Lm2, Lo2, n can be: Lm2=25 nm, Lo2=100 nm, n=17. Thus, it is possible to adjust the number of patterns only, as a function of the dimensions of the target enrichment region. This simplifies the design of the grating of masking patterns.

In general, to obtain a Ge concentration [Ge]i in an enrichment region i with a dimension Li, a grating of masking patterns can be inserted, comprising lines of characteristic dimension Lmi spaced apart by a period Loi, such that: $Li=n \cdot Lmi+(n+1) \cdot Loi$. The aperture density is thus written as $D=(n+1) \cdot Loi/Li \approx Loi/(Lmi+Loi)$.

Figure 8A:
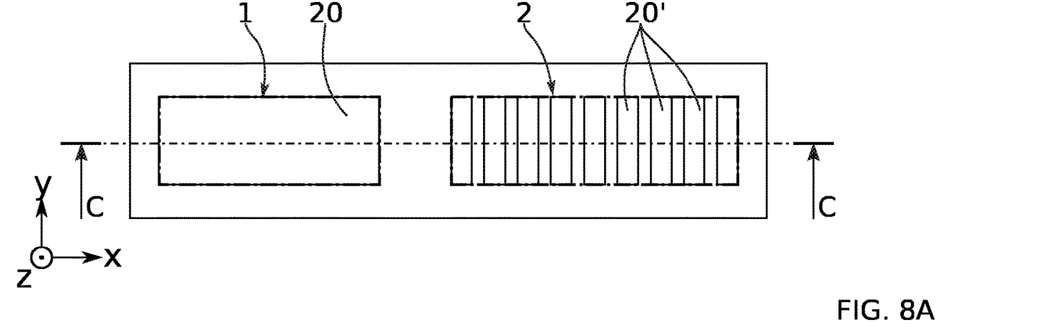
FIG. 8A diagrammatically shows an overhead view of a step of a method for forming SiGe-based regions according to one embodiment of the present invention.
Figure 8B:
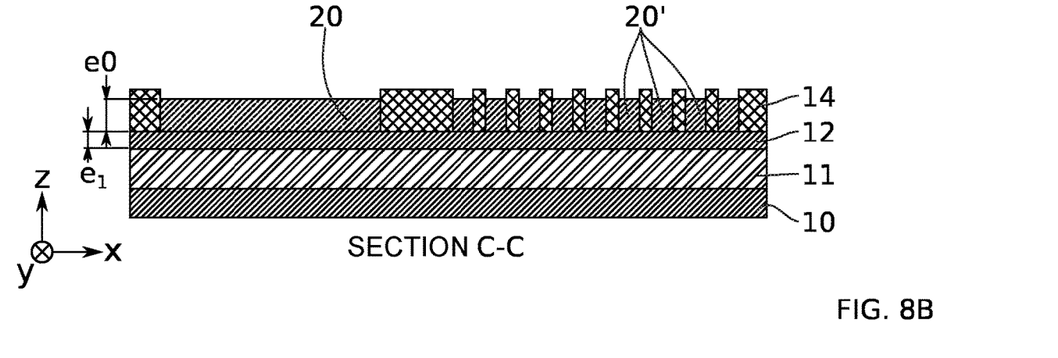
FIG. 8B diagrammatically shows a sectional view of the step of the method for forming SiGe-based regions shown in FIG. 8A.

As shown in FIG. 8A, 8B, after the formation of the grating of masking patterns, epitaxial growth of SiGe layers 20, 20' is carried out in the first and second enrichment regions 1, 2. This epitaxial growth can be selective, i.e. the layers 20, 20' grow only on the exposed surfaces of the topSi in the first and second regions 1, 2. According to an alternative possibility, it can be non-selective. It is preferably carried out in such a way as to avoid the formation of facets. Preferably, this is carried out in such a way that undoped SiGe layers 20, 20' are obtained.

The first region 1, free of masking patterns, typically has an aperture density equal to 1. The exposed surface area of the topSi 12 in the first region 1 is typically equal to the total surface area of the first region 1. Conversely, in the second region 2, the sum S' of the exposed surfaces 122 is strictly lower than the total surface area S of said second region 2, due to the masking patterns 3. The second region 2 has an aperture density strictly lower than the aperture density of the first region 1. The second enrichment region 2, on which the grating of masking patterns 3 is formed, has an aperture 4 density D of strictly less than 1, whereas the first enrichment region 1, which is free of any grating of masking patterns 3, has a so-called reference aperture density equal to 1.

The SiGe layer 20 epitaxially grown in the reference region 1 preferably has a thickness e0 comprised between 5 nm and 30 nm, preferably between 7 nm and 25 nm, and a Ge concentration [Ge]0 comprised between 10% and 30%.

The SiGe layers 20' epitaxially grown in the apertures 4 of the region 2 can advantageously have the same properties as the layer 20. Thus, the layers 20' preferably have a thickness e0 and a Ge concentration [Ge]0.

Figure 9A:
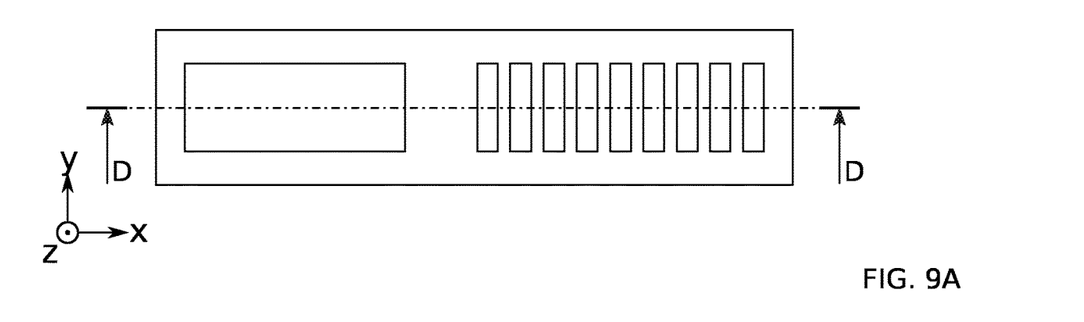
FIG. 9A diagrammatically shows an overhead view of a step of a method for forming SiGe-based regions according to one embodiment of the present invention.
Figure 9B:
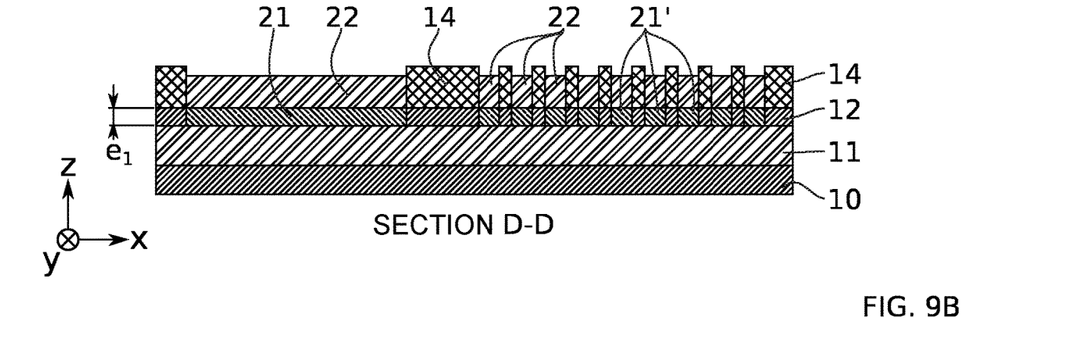
FIG. 9B diagrammatically shows a sectional view of the step of the method for forming SiGe-based regions shown in FIG. 9A.

As shown in FIG. 9A, 9B, after the epitaxial growth of the Ge-based layers 20, 20', a first diffusion of Ge from the layers 20, 20' to the topSi 12 is carried out by oxygen annealing. The oxygen annealing conditions are typically a temperature T1 comprised between 950° C. and 1,100° C., for a time t1 typically comprised between 5 s and 200 s. The shorter the oxygen annealing time t1, the better the diffusion interface. Oxygen annealing can be of the rapid thermal oxidation (RTO) type, for example at 950° C. or 1,050° C. for 60 s, or at 1,000° C. for 30 s, or at 1,100° C. for 5 s typically. Other pairs of values (T1, t1) can be chosen as a function of the thickness e and the nature of the thin layer 12 (Si or SiGe), or as a function of the oxidation chamber in which the oxygen anneal is carried out. Charts can be used or produced to determine the optimum oxygen annealing conditions. Oxygen annealing will in particular be shorter and/or at a lower temperature for a thin layer 12 of SiGe. Other oxygen anneals can be considered. The following oxygen anneals can in particular be considered:

An annealing method commonly referred to as "dry oxidation" comprising a temperature rise under atmospheric N2 with a start of the rise under O2, followed by annealing under O2 only, followed by a temperature drop under N2.

An annealing method commonly referred to as ISSG (acronym for "In-Situ Steam Generation [Oxidation]") comprising a first temperature rise under O2, followed by a second rise and annealing under O2+H2, followed by a temperature drop under O2.

The oxygen anneal can be adjusted as a function of the initial Ge concentration [Ge]0.

This first diffusion mainly occurs along z. It allows the topSi 12 to be enriched locally with Ge. A first SiGe-based portion 21 is thus formed at the reference region 1. SiGe-based parts 21' are thus formed at the modified region 2. The first portion 21 typically has a Ge concentration [Ge]1, and a thickness e1. Advantageously, the parts 21' each have a Ge concentration [Ge]1 and thickness e1. The thickness e1 can be greater than or equal to the thickness e0. Enrichment conditions are preferably chosen such that the thickness e1 remains substantially the same as the thickness e0. After diffusion, the portion 21 and the parts 21' are overlaid by an oxide layer 22.

According to one example, for a silicon thin layer 12 with a thickness e=8 nm and for a thickness of the Ge-based layers 20, 20' e0=8 nm, and for a Ge concentration of the layers 20, 20' [Ge]0=27%, the portion 21 and the parts 21' can have a thickness e1=9 nm and a Ge concentration [Ge]1=24%.

According to one example, for a silicon thin layer 12 with a thickness e=8 nm and for a thickness of the Ge-based layers 20, 20' e0=8 nm, and for a Ge concentration of the layers 20, 20' [Ge]0=27%, the portion 21 and the parts 21' can have a thickness e1=8 nm and a Ge concentration [Ge]1=27%.

Thus, the thickness e0 and the concentration [Ge]0 can be adjusted as a function of the thickness e and of the nature of the thin layer 12 (made of Si or SiGe), in order to obtain a portion 21 and parts 21' of desired thickness e1 and concentration [Ge]1.

Figure 10A:
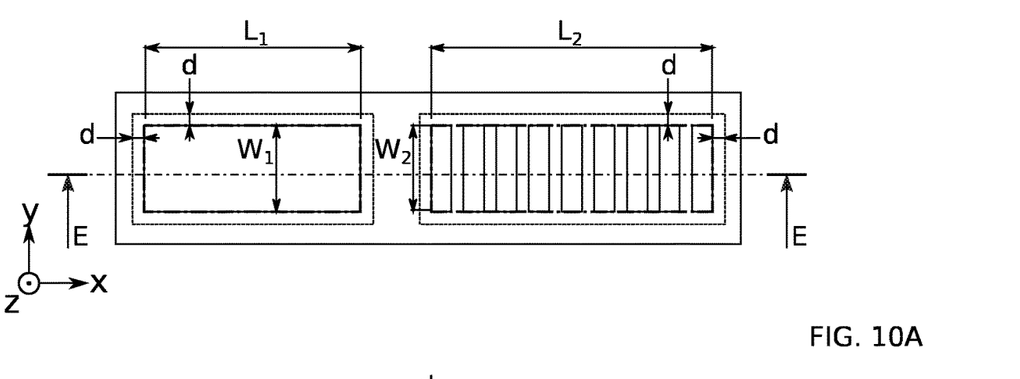
FIG. 10A diagrammatically shows an overhead view of a step of a method for forming SiGe-based regions according to one embodiment of the present invention.
Figure 10B:
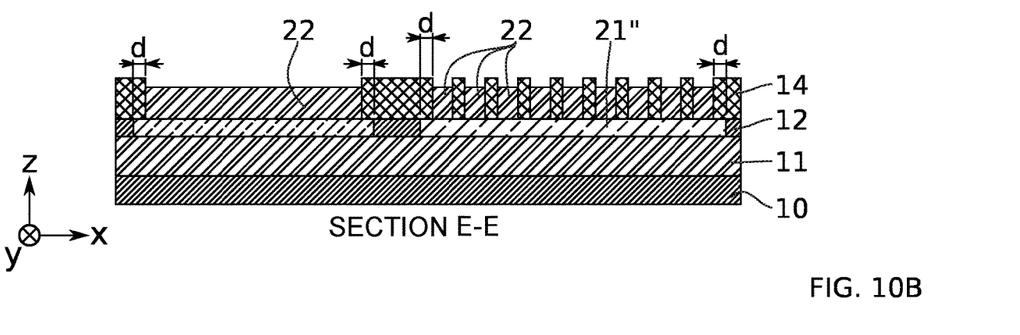
FIG. 10B diagrammatically shows a sectional view of the step of the method for forming SiGe-based regions shown in FIG. 10A.

As shown in FIG. 10A, 10B, after the formation of the portion 21 and of the parts 21', a second diffusion of Ge from said portion and parts 21, 21' to the topSi 12 is carried out by additional non-oxygen annealing.

This non-oxygen annealing is typically carried out in a neutral atmosphere, for example under argon, nitrogen or helium, at a temperature T2 typically comprised between 950° C. and 1,150° C., for a time t2 comprised between 5 s and 60 s. The non-oxygen annealing can be of the Rapid Thermal Anneal (RTA) type, for example at 1,100° C. for 30 s. Other pairs of values (T2, t2) can be chosen as a function of the thickness e and of the nature of the thin layer 12 (Si or SiGe). Non-oxygen annealing will in particular be shorter and/or carried out at a lower temperature for a thin layer 12 of SiGe, for example at 1,100° C. for 10 s, or at 1,000° C. for 30 s. According to one possibility, the non-oxygen anneal is carried out as a continuation of the oxygen anneal. The temperature thus does not need to be reduced between the two anneals.

This second diffusion occurs mainly in the xy-plane, for example along x in the case shown in FIG. 10A, 10B. This diffusion typically takes place over a diffusion distance d. The diffusion distance d can be comprised between about 10 nm and 25 nm, in particular as a function of the temperature T2 and the time t2. Such lateral diffusion advantageously allows the germanium concentration within the thin layer 12 to be homogenised over the entire enrichment region 2. In particular, the germanium diffuses beneath the masking patterns on either side of the parts 21'. A second SiGe-based portion 21" is thus formed at the region 2. This second portion 21" advantageously has a Ge concentration [Ge]2 that is lower than the concentration [Ge]1. This second portion 21" has a thickness e2 substantially equal to the thickness e1.

The phenomenon of lateral diffusion is very limited at the first portion 21. This occurs mainly at the periphery of the region 1, over a short distance d. At the end of the second diffusion, the first portion 21 thus has a Ge concentration substantially equal to [Ge]1.

The method thus makes it possible to simultaneously form, during a single enrichment module, a first SiGe-based portion 21 with a concentration [Ge]1 and a second SiGe-based portion 21" with a concentration [Ge]2 that is lower than the concentration [Ge]1.

Figure 11A:
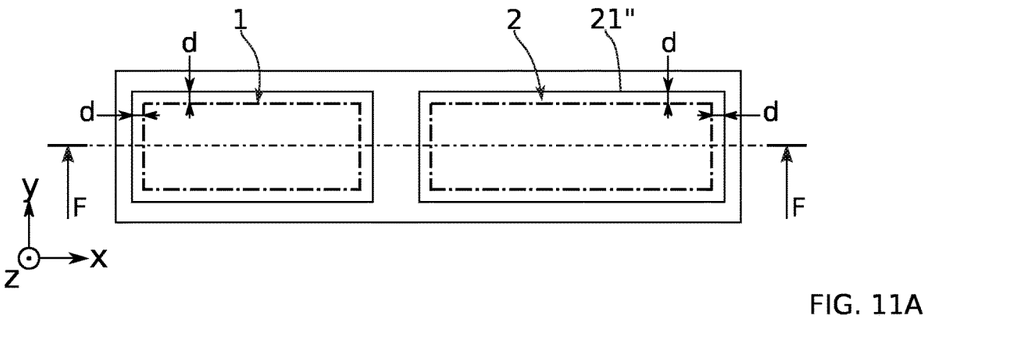
FIG. 11A diagrammatically shows an overhead view of a step of a method for forming SiGe-based regions according to one embodiment of the present invention.
Figure 11B:
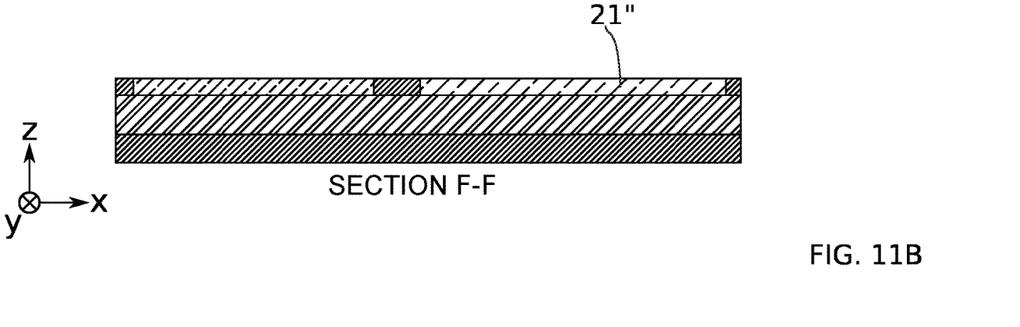
FIG. 11B diagrammatically shows a sectional view of the step of the method for forming SiGe-based regions shown in FIG. 11A.

As shown in FIG. 11A, 11B, after the formation of the portion 21 and of the portion 21", the oxide layer 22 and the hard mask 14 can be removed, for example by a wet etching method. Due to the lateral diffusion, the first and second regions 1, 2 extend over a distance d along the edge of the originally defined regions. This lateral overflow of the SiGe portions 21, 21" typically has a profile of decreasing Ge concentration, from [Ge]1, respectively from [Ge]2, to a zero concentration (or to the initial concentration of the thin layer in the case of an initial SiGe thin layer) for the masked regions located at a distance greater than d from the apertures.

Figure 12A:
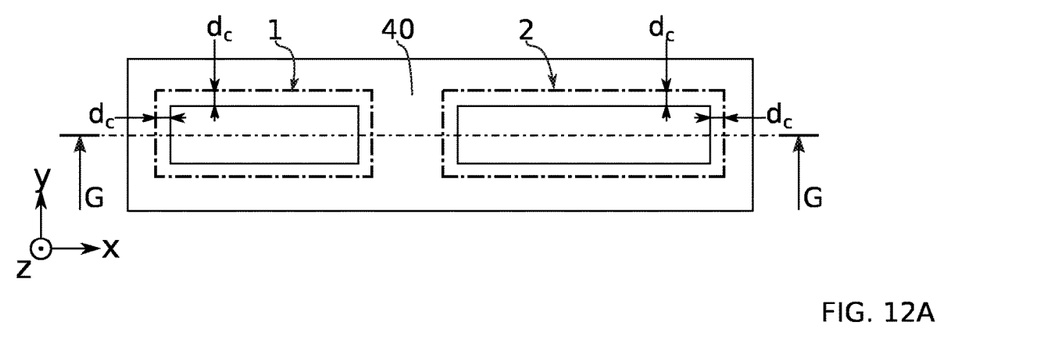
FIG. 12A diagrammatically shows an overhead view of a step of a method for forming SiGe-based regions according to one embodiment of the present invention.
Figure 12B:
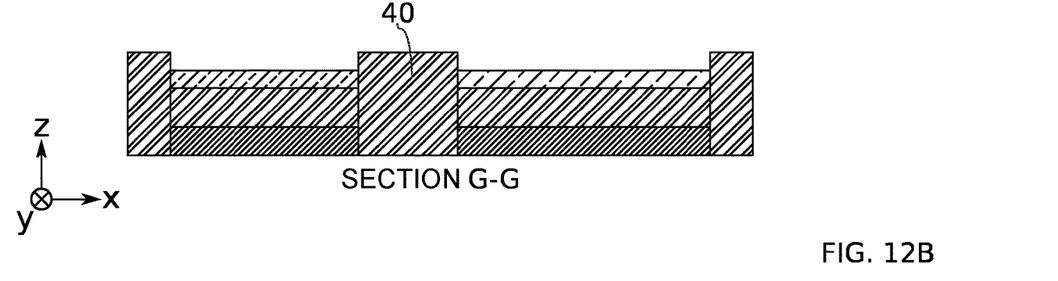
FIG. 12B diagrammatically shows a sectional view of the step of the method for forming SiGe-based regions shown in FIG. 12A.

As shown in FIG. 12A, 12B, the different regions 1, 2 can then be isolated from one another by STI isolation trenches 40 (Shallow Trench Isolation). The STI trenches 40 can be formed in a known manner by lithography/etching, filling and oxide densification. The isolation trenches are preferably defined such that the initial dimensions L1, W1, L2, W2 of the isolated regions 1, 2 are reduced by a distance 2·dc, where dc is a critical dimension of the order of 15 nm to 20 nm. This eliminates defects at the edges of the regions 1, 2, and/or the lateral overflow of progressively decreasing Ge concentration. This results in a steep profile at the edge of the regions 1, 2. The distance between two regions 1, 2, for example the length of the STI trench 40 along x, can be of the order of 50 nm to 70 nm.

The method can advantageously be used to form pFETs on the SiGe active regions of an electronic circuit. These transistors typically comprise a gate with a gate length Lg. The operation of these transistors is in particular characterised by a threshold voltage Vth. For some applications, not all pFETs have the same gate length Lg. The threshold voltage Vth is generally dependent on the gate length Lg. In order to optimise the overall operation of the electronic circuit, it can be of particular interest to have substantially the same threshold voltage Vth for all pFETs, irrespective of the gate lengths Lg thereof.

In order to obtain a substantially constant threshold voltage Vth for different gate lengths Lg, the Ge concentration of each of the SiGe active regions underlying said gates can be adjusted. For example, a relationship linking the threshold voltage Vth to the Ge concentration [Ge] of the SiGe and to the intrinsic strain E of the SiGe can be used, such as:

$$Vth(x) = Vth0 + Sx*[Ge] + S\varepsilon*\varepsilon([Ge])$$

Where Vth0 is the threshold voltage of a gate of a given gate length. The coefficients $Sx, S\varepsilon$ can be determined by modelling, for example according to the publication "F. Andrieu et al, "Strain and Layout Management in dual Channel (sSOI substrate, SiGe channel) planar FDSOI MOSFETs", Proc. of ESSDERC conference, pp. 106-109, 2014". According to one example, $Sx=10$ mV/% and $S\varepsilon=-93.74$ mV/%. The intrinsic strain $\varepsilon$ of the SiGe can also be expressed as:

$$\varepsilon([Ge]) = -0.042*[Ge]$$

For a gate of a given gate length, a proportional relationship thus exists between the threshold voltage Vth and the Ge concentration [Ge] of the SiGe in the active region underlying this gate. The Ge concentration [Ge] can thus be adjusted in separate active regions, so as to modify the threshold voltage Vth of the gates present in each of these regions.

Figure 13A:
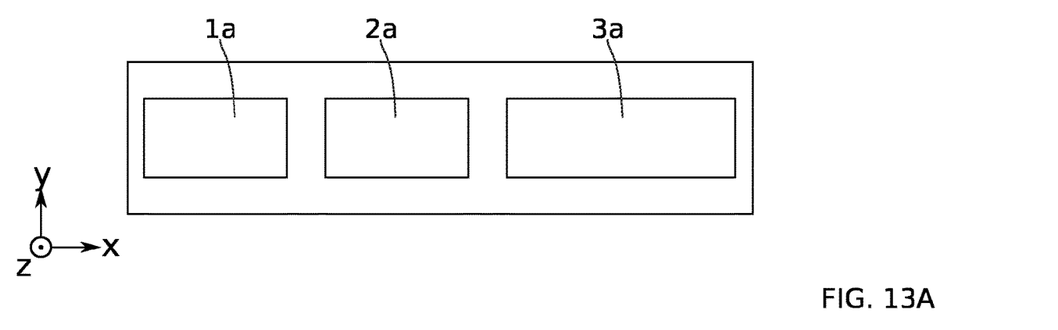
FIG. 13A diagrammatically shows an overhead view of a step of a method for forming SiGe-based regions according to another embodiment of the present invention.
Figure 13B:
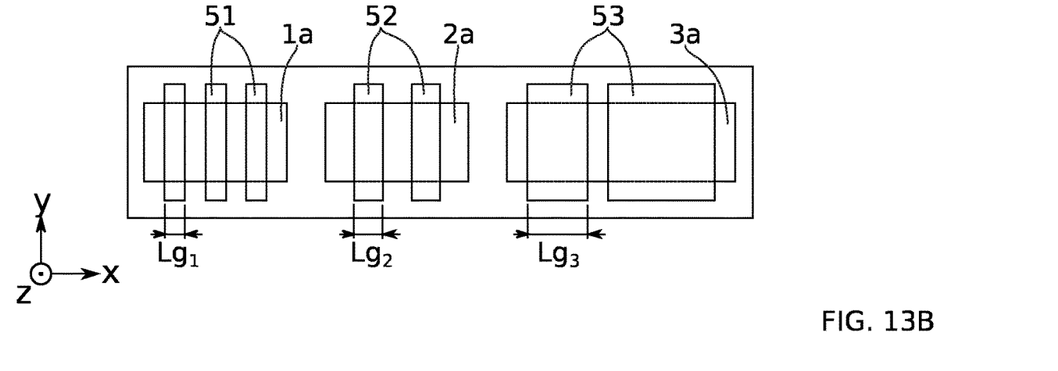
FIG. 13B diagrammatically shows an overhead view of a step of a method for forming SiGe-based regions according to another embodiment of the present invention.

As shown in FIG. 13A, 13B, the method advantageously allows this Ge concentration [Ge] to be adjusted in different active regions 1a, 2a, 3a. By forming the gates 51, 52, 53 respectively with different gate lengths Lg1, Lg2, Lg3 on these active regions 1a, 2a, 3a with different Ge concentrations [Ge]1, [Ge]2, [Ge]3, a substantially identical threshold voltage Vth can be obtained for all gates 51, 52, 53.

In particular, for gate lengths Lg1<Lg2<Lg3, concentrations [Ge]1<[Ge]2<[Ge]3 are chosen.

From the above description, it is clear that the proposed method offers a particularly efficient solution for producing SiGe-based active regions of the same thicknesses and with different Ge concentrations, when using one and the same enrichment module.

The invention is not limited to the aforementioned embodiments. According to one possibility, the first enrichment region is also obtained by vertical and then lateral diffusion beneath masking patterns. It shows the concentration [Ge]1 of germanium. In such a case, the second enrichment region is formed from a denser grating of masking patterns than in the first enrichment region. The aperture density of the second region is lower than the aperture density of the first region. After vertical and lateral diffusions, the second region thus has a germanium concentration [Ge]2 that is lower than the concentration [Ge]1.

The invention claimed is:

1. A method for forming at least two SiGe-based regions in a silicon-based layer, comprising steps of:
   providing a substrate comprising the silicon-based layer;
   defining at least a first enrichment region by exposing a first portion of the silicon-based layer;
   forming, by epitaxial growth, a first Ge-based layer with an initial Ge concentration [Ge]0 on the first portion, at the first enrichment region;
   diffusing, during a first diffusion by oxygen annealing, in a first direction z perpendicular to the first Ge-based layer, germanium of the first Ge-based layer in the first portion corresponding to the first enrichment region, the first portion thus becoming a first SiGe-based portion having a first Ge concentration [Ge]1, and the first Ge-based layer thus becoming a first oxide layer;
   defining at least a second enrichment region where the silicon-based layer is exposed, the at least one second enrichment region being separate from the first enrichment region;
   forming a grating of masking patterns on the exposed silicon-based layer within the at least one second enrichment region, so as to define a plurality of transient portions of the silicon-based layer;
   forming, by epitaxial growth, a second Ge-based layer with the initial Ge concentration [Ge]0 on the transient portions of the silicon-based layer, at the second enrichment region;
   diffusing, by oxygen annealing, in the first direction z, germanium of the second Ge-based layer into the transient portions, such that the transient portions become SiGe-based transient portions each having the first Ge concentration [Ge]1; and
   after the diffusing of the germanium by oxygen annealing in the first direction z, diffusing, during a second diffusion, in a second direction x parallel to the silicon-based layer, the germanium of the SiGe-based transient portions within the silicon-based layer, beneath the grating of masking patterns, so as to form at least a second SiGe-based portion having a second Ge concentration [Ge]2 that is lower than [Ge]1, at the second enrichment region.

2. The method according to claim 1, wherein the first and the second SiGe-based portions are formed simultaneously.

3. The method according to claim 1, wherein the grating of masking patterns is formed such that the grating has an aperture density D between 0 and 1, 0<D<1, and the second Ge concentration [Ge]2 is proportional to the aperture density D such that [Ge]2=D·[Ge]1.

4. The method according to claim 1, wherein the grating of masking patterns comprises masking patterns with a characteristic masking dimension $Lm_i$, spaced apart from one another by a grating period $Lo_i$, such that $10 > Lo_i / Lm_i > 2$.

5. The method according to claim 4, wherein the characteristic masking dimension $Lm_i$ is selected such that $Lm_i$ is less than twice a diffusion distance d of the germanium within the silicon-based layer in the second direction x, during the second diffusion.

6. The method according to claim 4, wherein the masking patterns are in the form of parallel lines, square or rectangular pads, or a gate.

7. The method according to claim 1, wherein the first and the second Ge-based layers are formed by one and the same epitaxial growth, such that the first and the second Ge-based layers have a same initial Ge concentration [Ge]0 and a same thickness.

8. The method according to claim 1, wherein the second diffusion takes place in a neutral or non-oxidizing atmosphere.

9. The method according to claim 1, wherein the second diffusion is configured in time and temperature such that a diffusion distance d of the germanium in the second direction x is between 10 nm and 30 nm.

10. The method according to claim 1, wherein the second diffusion is carried out at a temperature T2 between 950° C. and 1,150° C., for a time t2 between 5 s and 60 s.

11. The method according to claim 1, wherein the second diffusion is carried out under similar conditions to that of the first diffusion, such that the second diffusion forms a continuation of the first diffusion.

12. The method according to claim 1,
further comprising forming first and second gates on the first and the second SiGe-based portions, respectively, the first and the second gates having first and second gate lengths Lg1 and Lg2, respectively, and
the first and the second Ge concentrations [Ge]1 and [Ge]2 and the gate lengths Lg1 and Lg2 being such that the first and the second gates have an identical threshold voltage Vth.

13. An electronic device, comprising:

a substrate comprising a silicon-based layer, the silicon-based layer comprising at least a first SiGe-based portion having a first Ge concentration [Ge]1, and at least a second SiGe-based portion having a second Ge concentration [Ge]2 that is lower than [Ge]1, the first and the second portions being formed by the method according to claim 1; and first and second gates on the first and the second SiGe-based portions, respectively, the first and the second gates having first and second gate lengths Lg1 and Lg2, respectively, the first and the second Ge concentrations [Ge]1 and [Ge]2 and the gate lengths Lg1 and Lg2 being such that the first and the second gates have an identical threshold voltage Vth.

\* \* \* \* \*